(12) United States Patent
Zhang et al.

(10) Patent No.: US 10,325,929 B2
(45) Date of Patent: Jun. 18, 2019

(54) METHOD FOR FABRICATING A DISPLAY SUBSTRATE

(71) Applicant: BOE Technology Group Co., Ltd., Beijing (CN)

(72) Inventors: Feng Zhang, Beijing (CN); Zhijun Lv, Beijing (CN); Wenqu Liu, Beijing (CN); Liwen Dong, Beijing (CN); Shizheng Zhang, Beijing (CN); Ning Dang, Beijing (CN); Zhiyong Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/966,579

(22) Filed: Apr. 30, 2018

(65) Prior Publication Data

US 2019/0043893 A1  Feb. 7, 2019

(30) Foreign Application Priority Data

Aug. 2, 2017  (CN) .......................... 2017 1 0652934

(51) Int. Cl.
*H01L 25/00* (2006.01)
*H01L 27/12* (2006.01)
*H01L 27/32* (2006.01)
*G02F 1/1339* (2006.01)

(52) U.S. Cl.
CPC ...... *H01L 27/1214* (2013.01); *G02F 1/13394* (2013.01); *H01L 25/50* (2013.01); *H01L 27/3248* (2013.01); *H01L 27/3262* (2013.01); *G02F 2001/13396* (2013.01); *G02F 2001/13398* (2013.01)

(58) Field of Classification Search
CPC ......................... G02F 1/13394; H01L 27/3246
See application file for complete search history.

(56) References Cited

U.S. PATENT DOCUMENTS

2018/0226458 A1*  8/2018  Bai .................... H01L 27/3246

\* cited by examiner

*Primary Examiner* — Farun Lu
(74) *Attorney, Agent, or Firm* — Michael Fainberg; Arent Fox LLP

(57) ABSTRACT

The present disclosure discloses a method for fabricating a display substrate, belonging to the technical field of displaying. The method includes: providing a base substrate having an array of Thin Film Transistors; forming a photoresist pattern on the base substrate, the photoresist pattern including a hollow region for forming a spacer pattern; forming a spacer material in the hollow region; and peeling the photoresist pattern so that the spacer material in the hollow region forms the spacer pattern.

8 Claims, 4 Drawing Sheets

METHOD FOR FABRICATING A DISPLAY SUBSTRATE

CROSS-REFERENCE TO RELATED APPLICATIONS

This application claims the priority to Chinese Patent Application No. 201710652934.7, filed on Aug. 2, 2017, the content of which is hereby incorporated by reference in its entirety.

FIELD

The present disclosure relates to the technical field of displaying, and particularly to a method for fabricating a display substrate.

BACKGROUND

An Organic Light-Emitting Diode (OLED) display device is a display device with a self-light emitting function. An OLED display device includes a plurality of pixels arranged in a matrix form. OLED display devices can be categorized into Active Matrix Organic Light-Emitting Diode (AMO-LED) display devices and Passive Matrix Organic Light-Emitting Diode (PMOLED) display devices based on driving modes of the pixels, where the AMOLED display device is widely used in the display industry due to its advantages, such as thinness, light weight, active light emission, fast response, wide viewing angle, rich colors, high brightness, low power consumption, high-temperature resistance and low-temperature resistance.

The AMOLED display device generally includes a display substrate. The display substrate includes a base substrate and a plurality of Thin Film Transistors (TFTs) disposed on the base substrate. The display substrate further includes a planarization layer, a pixel defining layer and a spacer pattern, which are sequentially disposed on the base substrate provided with a plurality of TFTs.

In the related art, a method for preparing a spacer pattern in a display substrate generally includes: coating a spacer material on a base substrate provided with a pixel defining layer to form a spacer layer, and exposing the base substrate coated with the spacer layer under ultraviolet light using a mask to form a spacer pattern.

However, in the related art, when a spacer pattern is prepared, the spacer material is generally an organic resin material and the thickness of the spacer layer is large, but the area of the spacer pattern is smaller and the area to be exposed is large; therefore, the exposure energy of the ultraviolet light required for exposing the spacer layer is large; and when the ultraviolet light reaches an active layer in TFTs, the characteristics of the TFTs may drift (i.e., magnitudes of threshold voltages of multiple TFTs may vary), affecting the threshold voltages of the TFTs. When an image is displayed, if the multiple TFTs are loaded with the same voltage, since the threshold voltages of the TFTs are different, currents passing pixels corresponding to the multiple TFTs are also different, resulting in uneven brightness of the pixels on the display device and affecting the image display stability of the display device.

SUMMARY

A method for fabricating a display substrate is provided, the method including: providing a base substrate having an array of Thin Film Transistors; forming a photoresist pattern on the base substrate, the photoresist pattern including a hollow region for forming a spacer pattern; forming a spacer material in the hollow region; and peeling the photoresist pattern so that the spacer material in the hollow region forms the spacer pattern.

Optionally, the forming a photoresist pattern on the base substrate includes: coating a photoresist on the base substrate; exposing the photoresist under ultraviolet light using a mask; developing and etching the exposed photoresist sequentially.

Optionally before the peeling the photoresist pattern to form the spacer pattern, the method further includes: baking the spacer material at a predetermined temperature.

Optionally, the preset temperature ranges from 200° C. to 300° C.

Optionally, the forming a spacer material in the hollow region includes: coating a spacer material on the photoresist pattern.

Optionally, the forming a photoresist pattern on the base substrate includes: forming a planarization layer on the base substrate; forming a pixel defining layer on the base substrate formed with the planarization layer; and forming the photoresist pattern on the base substrate formed with the pixel defining layer.

Optionally, the hollow region includes a hollow hole that is in a shape of a circular truncated cone or a truncated pyramid.

Optionally, the spacer pattern has a thickness of 1 µm to 2 µm.

DETAILED DESCRIPTION OF THE EMBODIMENTS

In order to make the object, technical solutions and advantages of the present disclosure more clear, the embodiments of the present disclosure will be described further in detail below with reference to the accompanying drawings.

Figure 1:
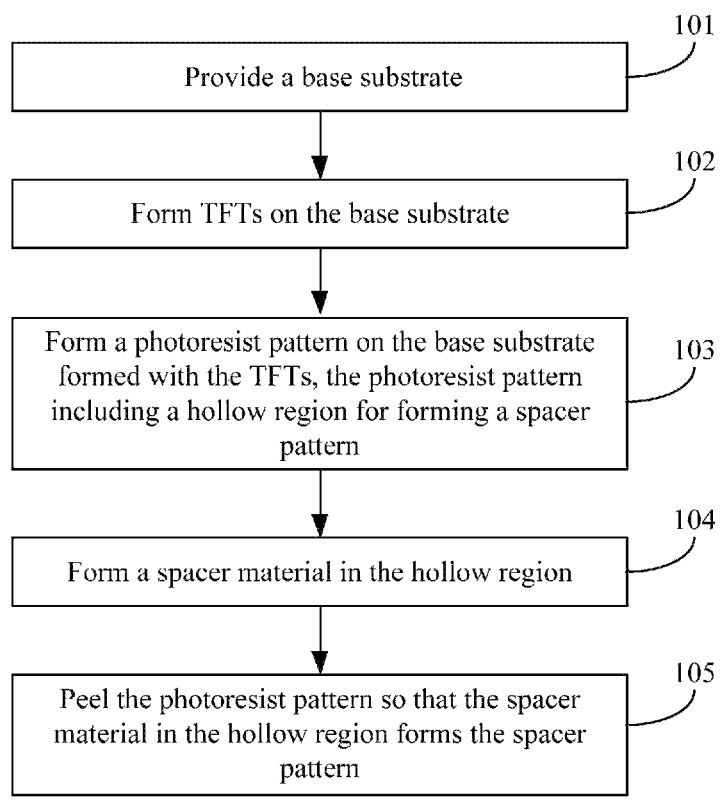
FIG. 1 is a flow chart of a method for fabricating a display substrate according to an embodiment of the present disclosure.

At present, the brightness of the pixels on the display device is uneven and thus the image display stability of the display device is affected when the display substrate is fabricated. In order to solve this problem, an embodiment of the present disclosure provides a method for fabricating a display substrate. As shown in FIG. 1, the method may include the following steps.

Step 101 is to provide a base substrate.

Step 102 is to form TFTs on the base substrate.

Step 103 is to form a photoresist pattern on the base substrate formed with the TFTs, the photoresist pattern including a hollow region for forming a spacer pattern.

Step 104 is to form a spacer material in the hollow region.

Step 105 is to peel the photoresist pattern so that the spacer material in the hollow region forms the spacer pattern.

To sum up, in the method for fabricating a display substrate according to the embodiment of the present disclosure, when a spacer pattern is formed, a photoresist pattern including a hollow region for forming a spacer pattern is first: formed on a base substrate formed with TFTs, and then a spacer material is formed on the base substrate formed with the photoresist pattern, and the photoresist pattern is peeled to form the spacer pattern. Since the photoresist has good photosensitivity when the photoresist pattern is formed, the required exposure energy of the ultraviolet light is smaller, and the ultraviolet light reaching the active layer in the TFTs can be reduced, thereby ensuring the stability of the display substrate.

Figure 2:
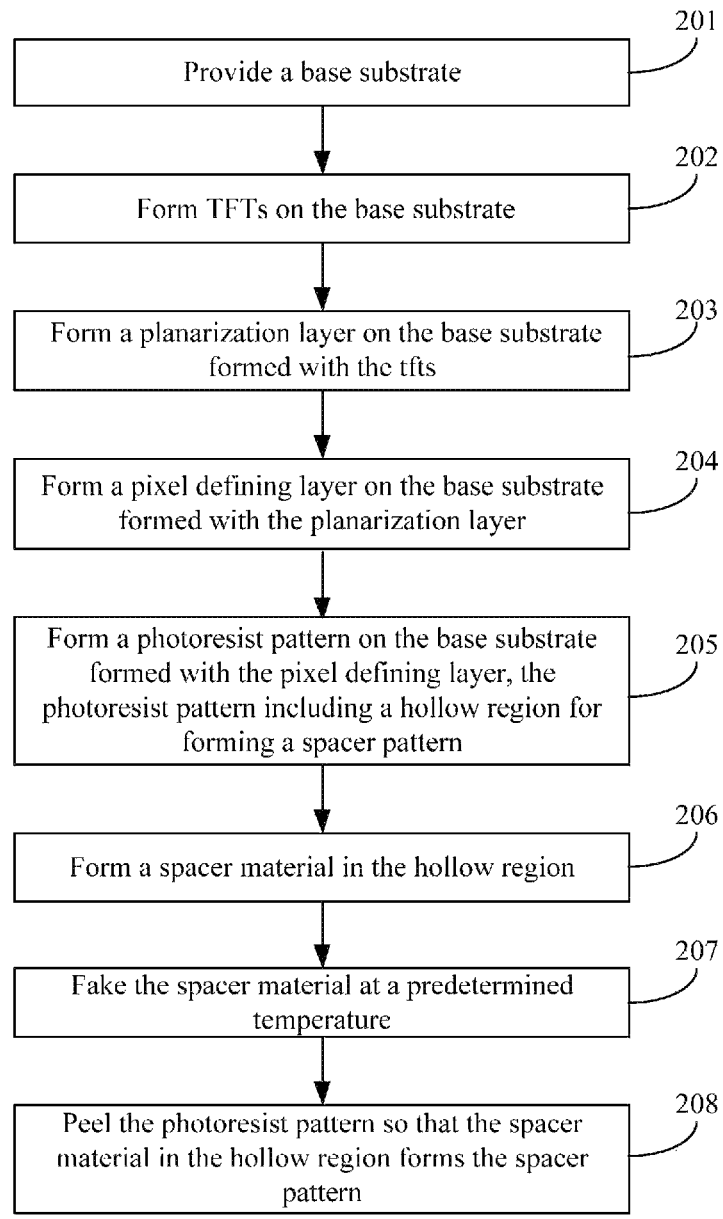
FIG. 2 is a flow chart of another method for fabricating a display substrate according to an embodiment of the present disclosure.

An embodiment of the present disclosure provides another method for fabricating a display substrate. As shown in FIG. 2, the method may include the following steps.

Step 201 is to provide a base substrate.

Optionally, the base substrate may be made of a transparent material such as glass, a silicon wafer, quartz, and plastic. Optionally, the base substrate is made of glass.

Step 202 is to form TFTs on the base substrate.

Optionally, forming TFTs on the base substrate may include: forming an active layer on the base substrate; sequentially forming a gate insulating layer, a gate, and a source-drain pattern on the base substrate formed with the active layer. The source-drain pattern includes a source and a drain.

The gate insulating layer may be made of silicon nitride, the gate and the source-drain pattern may be made of aluminum or molybdenum, and the active layer may be a Polycrystal Silicon (P-Si) layer.

Specifically, P-Si may be disposed, coated, or sputtered on the base substrate, and an active layer may be formed through a patterning process. Further, a film layer of a gate insulating layer is formed on the active layer through one of multiple methods such as deposition, coating and sputtering, and then a patterning process is performed on the film layer of the gate insulating layer to form a gate insulating layer. Furthermore, a gate layer is formed on the gate insulating layer through one of multiple methods such as deposition, coating and sputtering, and then a patterning process is performed on the gate layer to form a gate. Furthermore, a source-drain layer is formed on the gate through one of multiple methods such as deposition, coating and sputtering, and then a patterning process is performed on the source-drain layer to form a source-drain pattern. A patterning process may include coating, exposing, developing, etching, and peeling a photoresist.

Figure 3:
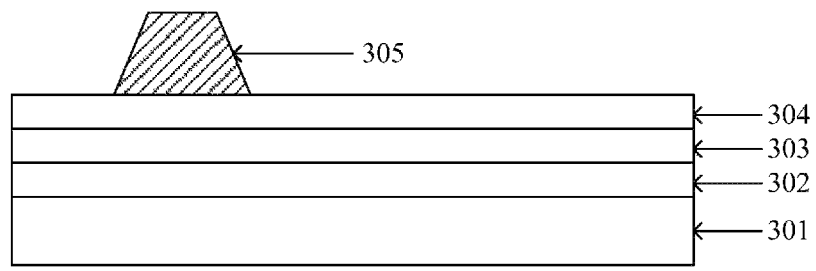
FIG. 3 is a schematic diagram of the structure of a display substrate according to an embodiment of the present disclosure.

As an example, as shown in FIG. 3, the display substrate includes a base substrate 301, and the base substrate 301 is provided with TFTs 302.

Step 203 is to form a planarization layer on the base substrate formed with the TFTs.

Further, as shown in FIG. 3, a planarization layer 303 is disposed on the base substrate 301 provided with the TFTs 302. Optionally, the planarization layer may be made of silicon nitride.

Step 204 is to form a pixel defining layer on the base substrate formed with the planarization layer.

The pixel defining layer may be used to define an opening of a light emitting region of an organic light emitting element.

Further, as shown in FIG. 3, a pixel defining layer 304 is disposed on the base substrate 301 provided with the planarization layer 303.

Step 205 is to form a photoresist pattern on the base substrate formed with the pixel defining layer, the photoresist pattern including a hollow region for forming a spacer pattern.

Optionally, forming a photoresist pattern on the base substrate formed with the pixel defining layer may include: coating a photoresist on the base substrate formed with the TFTs; exposing the base substrate coated with the photoresist under ultraviolet light using a mask; and developing and etching the exposed base substrate to obtain a photoresist pattern.

Figure 4A:
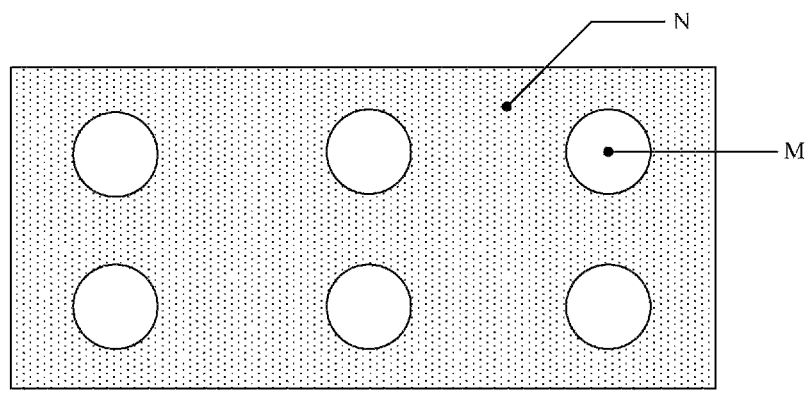
FIG. 4A is a schematic diagram of the structure of a mask according to an embodiment of the present disclosure.
Figure 4B:
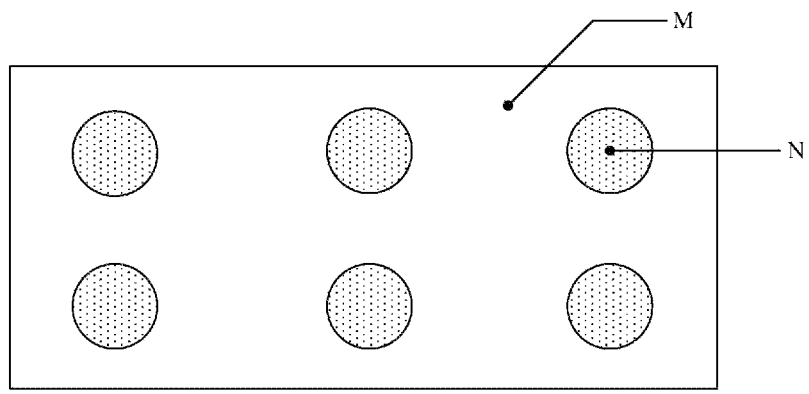
FIG. 4B is a schematic diagram of the structure of another mask according to an embodiment of the present disclosure.

When the photoresist is a positive photoresist, the base substrate coated with the photoresist is exposed under ultraviolet light using a light-transmitting region of the mask. The structure diagram of the mask may be as shown in FIG. 4A; when the photoresist, is a negative photoresist, the base substrate coated with the photoresist is exposed under ultraviolet light using an opaque region of the mask, and the structure diagram of the mask may be as shown in FIG. 4B. In FIGS. 4A and 4B, the region M is the light-transmitting region of the mask, and the region N is the opaque region of the mask.

Optionally, the hollow region may include a hollow hole that is in the shape of a circular truncated cone or a truncated pyramid. The formed photoresist pattern may have a thickness of 1 μm to 2 μm.

Step 206 is to form a spacer material in the hollow region.

Optionally, a spacer material may be coated onto the photoresist pattern, and a spacer material may also be filled in the hollow region of the photoresist pattern by means of deposition or sputtering. The embodiment of the present disclosure is not intended to limit the method of forming the spacer material in the hollow region.

The spacer material may be an organic solution dissolved with a resin material.

Step 207 is to bake the spacer material at a predetermined temperature.

Optionally, the preset temperature ranges from 200° C. to 300° C., and optionally is 230° C.

Since the spacer material is an organic solution dissolved with a resin material; after being coated onto the photoresist pattern, the spacer material is baked to evaporate the organic solution to leave a solid resin material, thus ensuring that the formed spacer pattern plays a good supporting role for the display substrate.

Step 208 is to peel the photoresist pattern so that the spacer material in the hollow region forms the spacer pattern.

Optionally; the spacer pattern has a thickness of 1 μm to 2 μm.

Furthermore, as shown in FIG. 3, a spacer pattern 305 is disposed on the base substrate 301 provided with the pixel defining layer 304.

Figure 5:
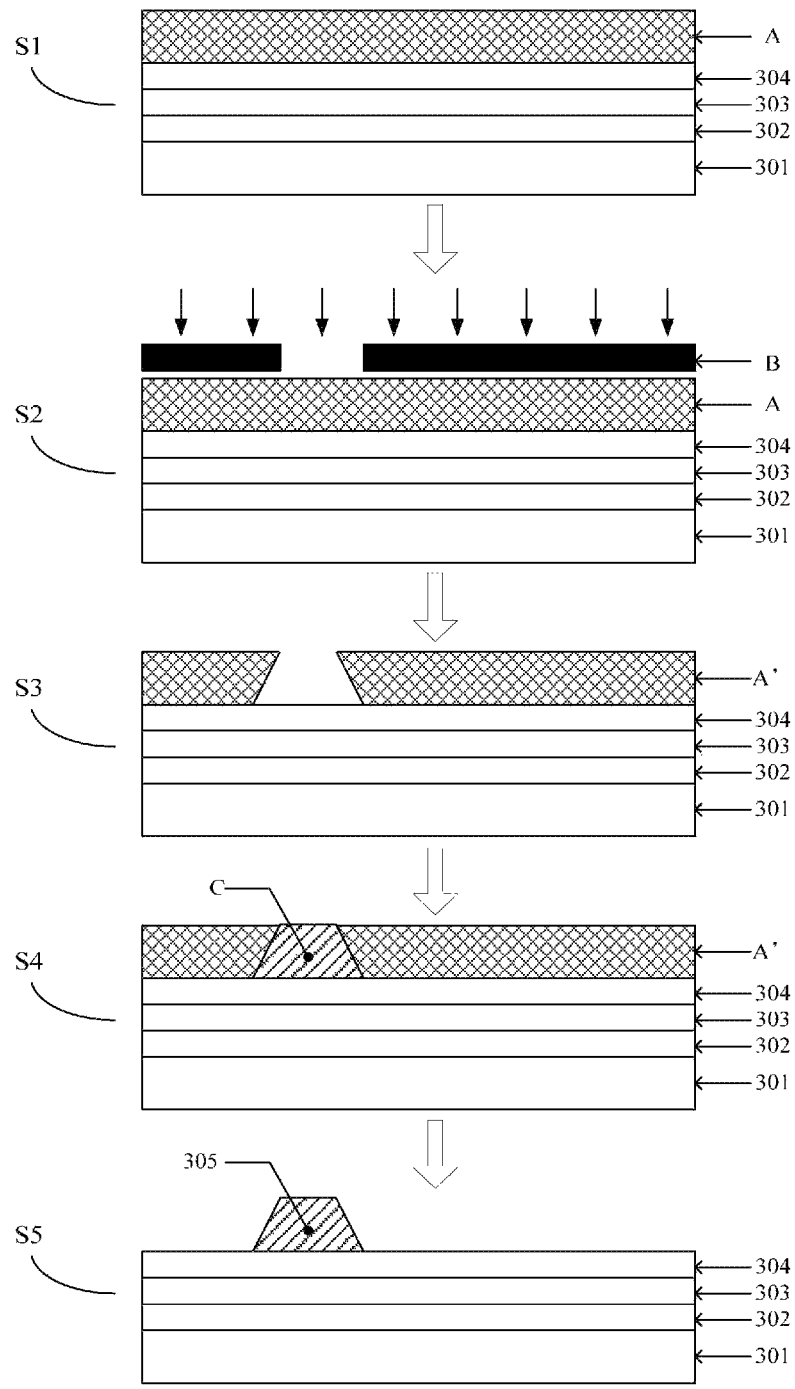
FIG. 5 is a flowchart of a process for forming a spacer pattern according to an embodiment of the present disclosure.

The embodiment of the present disclosure is described by using a positive photoresist as an example. FIG. 5 is a flowchart of a processing for forming a spacer pattern on the base substrate 301 formed with the TFTs 302, the planarization layer 303 and the pixel defining layer 304, and as shown in FIG. 5, the process flow includes the following steps.

S1, a photoresist layer A is formed on the base substrate 301 on which the TFTs 302, the planarization layer 303 and the pixel defining layer 304 are formed.

Optionally, the photoresist layer A may be formed by means of coating a photoresist.

S2, a mask B is arranged on the photoresist layer A, and the photoresist layer is exposed under ultraviolet light using the light-transmitting region of the mask B.

S3, the exposed photoresist layer A is developed and etched to obtain a photoresist pattern A'.

S4, a spacer material C is formed on the photoresist pattern A'.

Optionally; as shown in FIG. 5, the spacer material C is formed in the hollow region of the photoresist pattern. In addition, an entire layer of spacer material may be formed on the photoresist pattern by means of coating.

S5, after the spacer material C is baked, the photoresist pattern A' is peeled to obtain a spacer pattern 305.

In the related art, in the preparation of the spacer pattern, the exposure area of the spacer material exposed with ultraviolet light is greater than 95% of the area of the coated spacer layer, and the exposure energy per unit area is greater than 100 megajoules (mJ). In the embodiment of the present disclosure, a photoresist pattern is used to prepare a spacer pattern. As shown in FIG. 5, when the photoresist layer is exposed by ultraviolet light, the exposure area is much smaller than that of the coated photoresist layer. Generally, the exposure area is less than 5% of the area of the coated photoresist layer and the exposure energy per unit area is about 30 mJ, which can greatly reduce ultraviolet light reaching the active layer in the TFTs, thereby effectively ensuring the stability of the display substrate.

It should be noted that the order of the steps of the method for fabricating a display substrate according to the embodiment of the present disclosure may be adjusted appropriately, and the steps may also be correspondingly increased or decreased according to a situation. Any of method variations, readily conceived of by a person familiar with the technical field within the scope of the technology disclosed by the present disclosure, should fall within the scope of protection of the present disclosure and will not be further described herein.

To sum up, in the method for fabricating a display substrate according to the embodiment of the present disclosure, when a spacer pattern is formed, a photoresist pattern including a hollow region for forming a spacer pattern is first formed on a base substrate on which TFTs are formed, and then a spacer material is formed on the base substrate on which the photoresist pattern is formed, and the photoresist pattern is peeled to form the spacer pattern. Since the photoresist has good photosensitivity when the photoresist pattern is formed, the required exposure energy of the ultraviolet light is smaller, and the ultraviolet light reaching the active layer in the TFTs can be reduced, thereby ensuring the stability of the display substrate.

The foregoing merely refers to optional embodiments of the present disclosure and is not intended to limit the present disclosure. Any of modifications, equivalent substitutions and improvements, etc. made within the spirit and principle of the present disclosure shall be covered in the protection scope of the present disclosure.

The invention claimed is:

1. A method for fabricating a display substrate, comprising:
    providing a base substrate having an array of Thin Film Transistors;
    forming a photoresist pattern on the base substrate, the photoresist pattern including a hollow region for forming a spacer pattern;
    forming a spacer material in the hollow region; and
    peeling the photoresist pattern so that the spacer material in the hollow region forms the spacer pattern.

2. The method according to claim 1, wherein the forming the photoresist pattern on the base substrate comprises:
    coating a photoresist on the base substrate;
    exposing the photoresist under ultraviolet light using a mask; and
    developing and etching the exposed photoresist sequentially.

3. The method according to claim 1, wherein before peeling the photoresist pattern to form the spacer pattern, the method further comprises:
    baking the spacer material at a predetermined temperature.

4. The method according to claim 3, wherein the predetermined temperature ranges from 200° C. to 300° C.

5. The method according to claim 1, wherein the forming the spacer material in the hollow region comprises:
    coating the spacer material on the photoresist pattern.

6. The method according to claim 1, wherein the forming the photoresist pattern on the base substrate comprises:
    forming a planarization layer on the base substrate;
    forming a pixel defining layer on the base substrate formed with the planarization layer; and
    forming the photoresist pattern on the base substrate formed with the pixel defining layer.

7. The method according to claim 1, wherein the hollow region comprises a hollow hole that is in a shape of a circular truncated cone or a truncated pyramid.

8. The method according to claim 1, wherein the spacer pattern has a thickness of 1 μm to 2 μm.

* * * * *